United States Patent
Joshi

(10) Patent No.: US 7,170,809 B2
(45) Date of Patent: Jan. 30, 2007

(54) STABLE MEMORY WITH HIGH MOBILITY CELL DEVICES

(75) Inventor: Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 11/128,675

(22) Filed: May 13, 2005

(65) Prior Publication Data

US 2006/0256605 A1  Nov. 16, 2006

(51) Int. Cl.
*G11C 5/14* (2006.01)
*G11C 11/00* (2006.01)

(52) U.S. Cl. ..................... 365/226; 365/154
(58) Field of Classification Search ............... 365/226, 365/154, 156
See application file for complete search history.

(56) References Cited

U.S. PATENT DOCUMENTS

| | | | | |
|---|---|---|---|---|
| 6,335,891 B1 * | 1/2002 | Wilkins | ............... | 365/225.7 |
| 6,724,648 B2 * | 4/2004 | Khellah et al. | ............ | 365/154 |
| 6,903,962 B2 * | 6/2005 | Nii | ............... | 365/156 |
| 2004/0130930 A1 * | 7/2004 | Houston | ............... | 365/154 |

* cited by examiner

*Primary Examiner*—Anh Phung
(74) *Attorney, Agent, or Firm*—Keusey, Tutunjian & Bitetto, P.C.; Rafael Perez-Pineiro, Esq.

(57) ABSTRACT

A random access memory includes a logic circuit coupled to a power supply of a column having a memory cell. The logic circuit adjusts the supply voltage for the memory cell in the column in accordance with a control signal. A control circuit is coupled to the logic circuit, which generates the control signal in accordance with an operation type and whether the column is selected, such that the logic circuit selects the supply voltage in accordance with the control signal. The cell may include high mobility devices to improve performance.

30 Claims, 6 Drawing Sheets

STABLE MEMORY WITH HIGH MOBILITY CELL DEVICES

BACKGROUND

1. Technical Field

The present invention relates to circuits and circuit designs, and in particular to circuits which account for inter-die and intra-die variations.

2. Description of the Related Art

As the technology scales, inter-die and intra-die variations in process parameters (e.g., channel length (L), width (W), threshold voltage (Vt), etc.) have become serious problems in circuit design. The device-to-device (intra-die) variations in L, W or Vt between the neighboring transistors in an SRAM cell can significantly degrade not only stability of the cell but read and write delays. This causes minimum voltage conditions for read and write operations as the PFET threshold voltage degrades due to the negative bias temperature instability (NBTI) effect after burn-in.

If the PFET is made too strong then the "write margin" degrades significantly. To alleviate these problems and minimize the half select (unselected cells on the selected wordline) situation, new circuits and design techniques are needed.

SUMMARY

A random access memory includes a logic circuit coupled to a power supply of a column having a memory cell, The logic circuit adjusts the supply voltage for the memory cell in the column in accordance with a control signal. A control circuit is coupled to the logic circuit, which generates the control signal in accordance with an operation type and whether the column is selected, such that the logic circuit selects the supply voltage in accordance with the control signal. The cell may include high mobility devices to improve performance and minimum voltage at which SRAM can operate in read and write operations. The devices may utilize strained silicon technology or high mobility devices to improve reliability and performance.

These and other objects, features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFFERED EMBODIMENTS

Embodiments of the present invention implements circuits to provide for better reliability in memory cells. By employing high performance gating operations for providing a power supply voltage to a memory cell or column of cells, greater flexibility and margin is achieved. This ensures that despite low voltages, write operations will result in the appropriate data being stored. This promotes the stability and reliability of the memory device and memory cells.

It should be understood that the elements shown in the FIGS. may be implemented in various forms of hardware, including integrated circuit chips. Preferably, these elements are implemented in static random access memory cells although the teachings may be applied to other technologies, for example, dynamic random access memories and the like.

The circuit or circuits as described herein may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
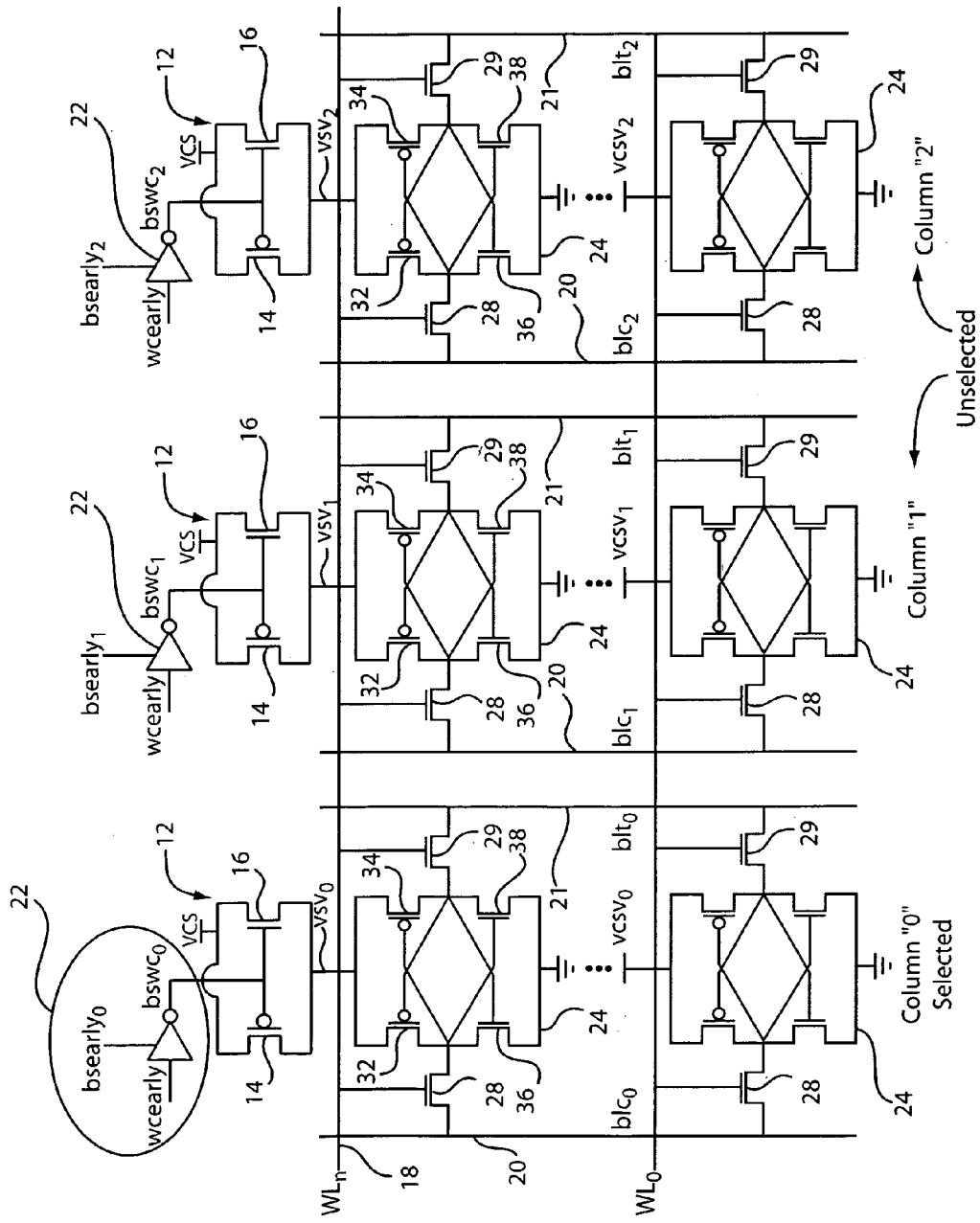
FIG. 1 is a schematic diagram of an illustrative memory device in accordance with one aspect of the present invention.

Referring now in detail to the figures in which like numerals represent the same or similar elements and initially to FIG. 1, an embodiment will illustratively be described in terms of a circuit structure or memory circuit 10 to demonstrate concepts in accordance with the present invention.

Circuit 10 is preferably implemented in a solid state device, such as a random access memory chip or other memory device. Circuit 10 may include a static random access memory (SPAM) although other memory types may also be employed. Circuit 10 may be employed in a plurality of applications, e.g., in caches, microprocessors, memory buffers in application specific integrated circuits (ASICs), etc.

Static random access memories (SRAM) include cells 24, which may include six transistors (6T SRAM) that store data and can be read from and written to without a refresh cycle. Four transistors 32, 34, 36 and 38 include a combination of PFET (p-doped field effect transistors) and NFET (n-doped field effect transistors) transistors. In the embodiment shown, transistors 32 and 34 are PFETs while transistors 36 and 38 are NFETs. Gates of transistors 32 and 36 are connected, as are gates of transistors 34 and 38. Transistors 32 and 34 provide a supply voltage VCSV (Voltage cell supply virtual) under appropriate signal conditions while transistors 36 and 38 provide conduction to ground (GND) under other appropriate conditions.

The gates of transistors 32 and 36 are activated by a transistor 29, which connects a bitline signal blt (bitline true) from a bitline 21 when transistor 29 is conducting. Likewise, the gates of transistors 34 and 38 are activated by a transistor 28, which connects a bitline signal blc (bitline complement) from a bitline 20 when transistor 28 is conducting. Gates of transistors 28 and 29 are activated/deactivated in accordance with a wordline signal (WL) from a wordline(s) 18.

Cells 24 are arranged in columns (e.g., column 0, column 1, column 2, etc.). For the example shown, column 0 is activated or selected while columns 1 and 2 are not selected. Each column has at least one memory cell.

In accordance with one embodiment, the PFETs 32, 34 and NFETs 36, 38 in the cells 24 include high mobility devices preferably achieved by a strained Si—Ge layer or application of stresses through liners deposited on CMOS devices. "High mobility devices" refers to devices or transistors having high carrier mobilities. High mobilities preferably includes mobilities greater than the mobilities of silicon, and more particularly mobilities of greater than 300 $cm^2$/V-sec for p at $10^{17}/cm^{-3}$ impurity concentration and greater than 500 $cm^2$/V-sec for n at $10^{17}/cm^{-3}$ impurity concentration. While these mobilities are illustrative of high mobility devices, such concentrations are dependent on the type of material and structure, as known to those skilled in the art.

Such high mobility devices may be created during fabrication by employing, e.g., Si—Ge (different thermal expansion coefficient, or lattice mismatches between Si and material deposited on top or materials which can induce strains in the channels) and changing stresses by depositing liners on CMOS devices which can induce strains in the device channels to achieve desired performance goals. High mobility devices are preferred to ensure the least amount of impedance and therefore the lowest voltage drop across the transistors and the highest performance.

Also, these devices can operate at lower voltages as they will still maintain high $I_{off}$ currents. The parameters which are important for performance include high mobilities and lower off currents. Devices which provide these features are suitable for enhancing aspects of the present invention.

A power supply, VCS, of each column is then gated by a logic circuit 12. Logic circuit 12 may include a PFET 14 coupled in parallel with an NFET 16. Gates of PFET 14 and NFET 16 devices are sized with an appropriate device strength to provide an appropriate connection between VCS and cells 24 in each column. Control signals wcearly (Write control early signal) and bsearly (Bit select early signal) are applied a logic gate, control circuit or other device 22 to provide a control signal bswc (the combination of bit select and write control signal) to the gates of transistor 14 and 16.

Device 22 may include an inverter which is enabled with a first signal (turned on) and inverts an input or a second signal. Note that in one embodiment, as shown in FIG. 1, the input signal includes the wcearly signal, which is derived from a write enable address signal, and the bsearly (bit select signal) is employed to enable the inverter of circuit 22 and is derived from a bit address signal. The write enable address and the bit address signals are known in the art. The write enable address signal indicates a write operation and the bit address signal indicates that the column has been selected. While these signals are preferred, other signals on device 10 may be employed to indicate the operation and the column selected in accordance with the present invention.

A truth table shows the control logic to generate bswc signals in Table 1. The timing of the bsearly and wcearly signals is significant rendering the resultant bswc signal. VCSV is applied supply voltage to the cells 24.

TABLE 1

| bsearly | wcearly | bswc | Operation | VCSV |
|---------|---------|------|-----------|------|
| 0 | 0 | 0 | column unselect | VCS |
| 0 | 1 | 0 | column unselect | VCS |
| 1 | 0 | 1 | column select "write" | VCS - Vt drop |
| 1 | 1 | 0 | column select "read" | VCS |

When a column is selected, e.g., in this example column 0, and the operation is "write", NFET 16, connected to the power supply VCS, drops the voltage by an NFET threshold voltage (Vt) drop (e.g., to VCSV). NFET Vt can be tailored to achieve a desired minimum voltage. For "read operation" or where the column is not selected, the supply voltage VCS is provided at VCSV. Stacked NFETs may also be employed to achieve further voltage drops in supply voltage VCS if warranted.

Figure 2:
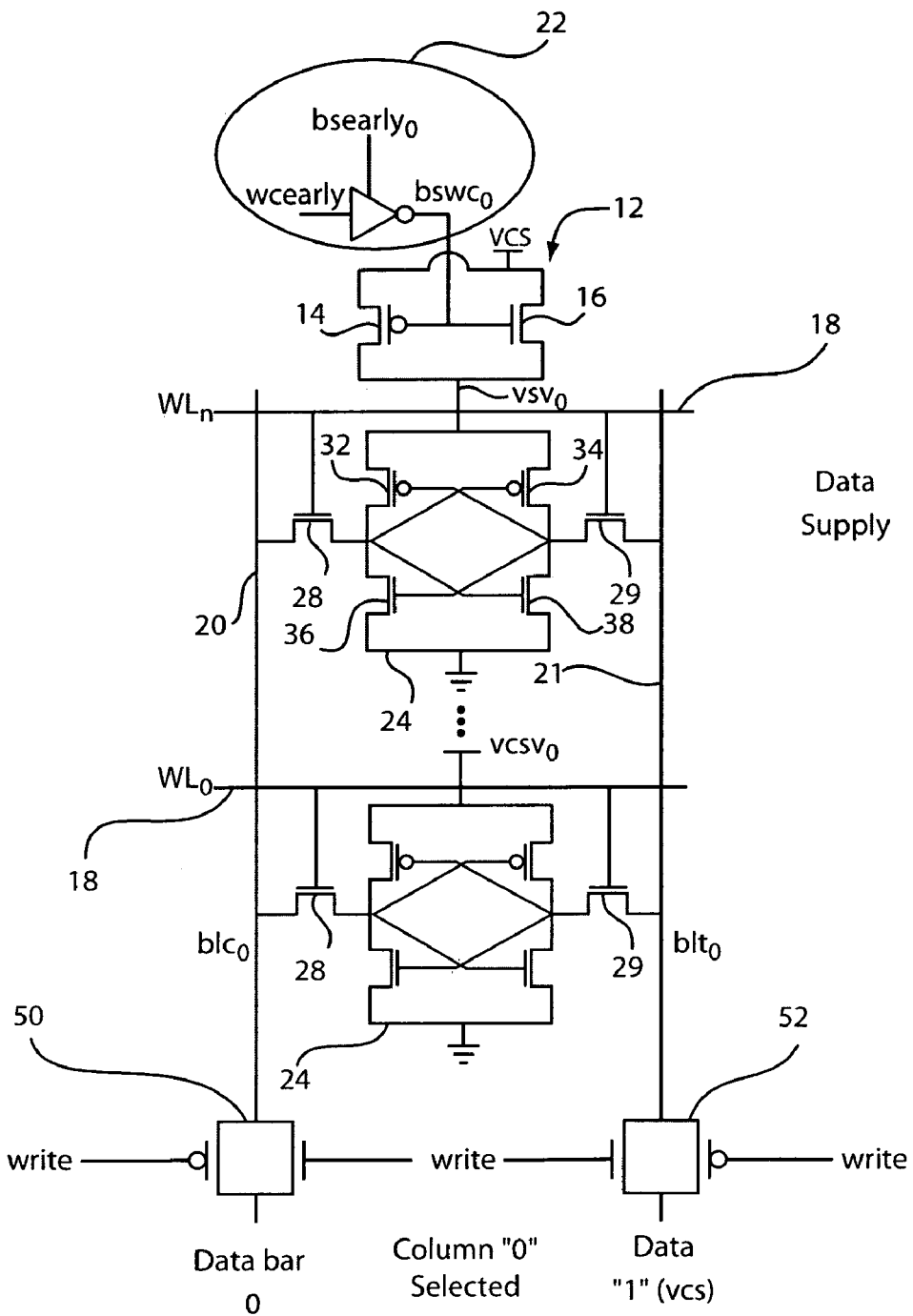
FIG. 2 is schematic diagram of another illustrative embodiment of the memory device showing data drivers in accordance with one aspect of the present invention.

Referring to FIG. 2, during the write operation of a binary "1", data drivers 50 and 52 can be supplied with a higher voltage, say VCS. For example, during a write operation where data is a "1", VCS is supplied to data driver 52. The cell 24 is supplied with VCSV, which in this case equals VCS minus the NFET (16) Vt drop. Thus, dropping the cell supply (VCSV) and increasing the data supply (VCS) provides more favorable conditions for writeability in cells 24. The data is written "efficiently" into the cell 24 as the cell supply is collapsed during the write operation.

When data to be written includes a "0", data driver 50 includes a supply voltage of VCS or Vdd.

Referring to FIGS. 1 and 2, during operations, a column (e.g., column 0) may be selected and a column (e.g., column 2) may not be selected (unselected cell column). When a wordline (WL) is on, the unselected column in a conventional SRAM device (6T) cell becomes "half selected" as a result of the conventional wiring structure. Due to leakage from, e.g., the bitlines (20 and 21), improperly toleranced cells and/or threshold voltage mismatches due to size and dopant difference in the devices in the conventional SRAM, cells can flip causing them to dump stored data or otherwise malfunction. Threshold voltage mismatches of cross-coupled devices due to, e.g., length and width variations and dopant fluctuations can especially cause flipping of the cells in a "half select mode" that may be created by these conditions.

Figure 6:
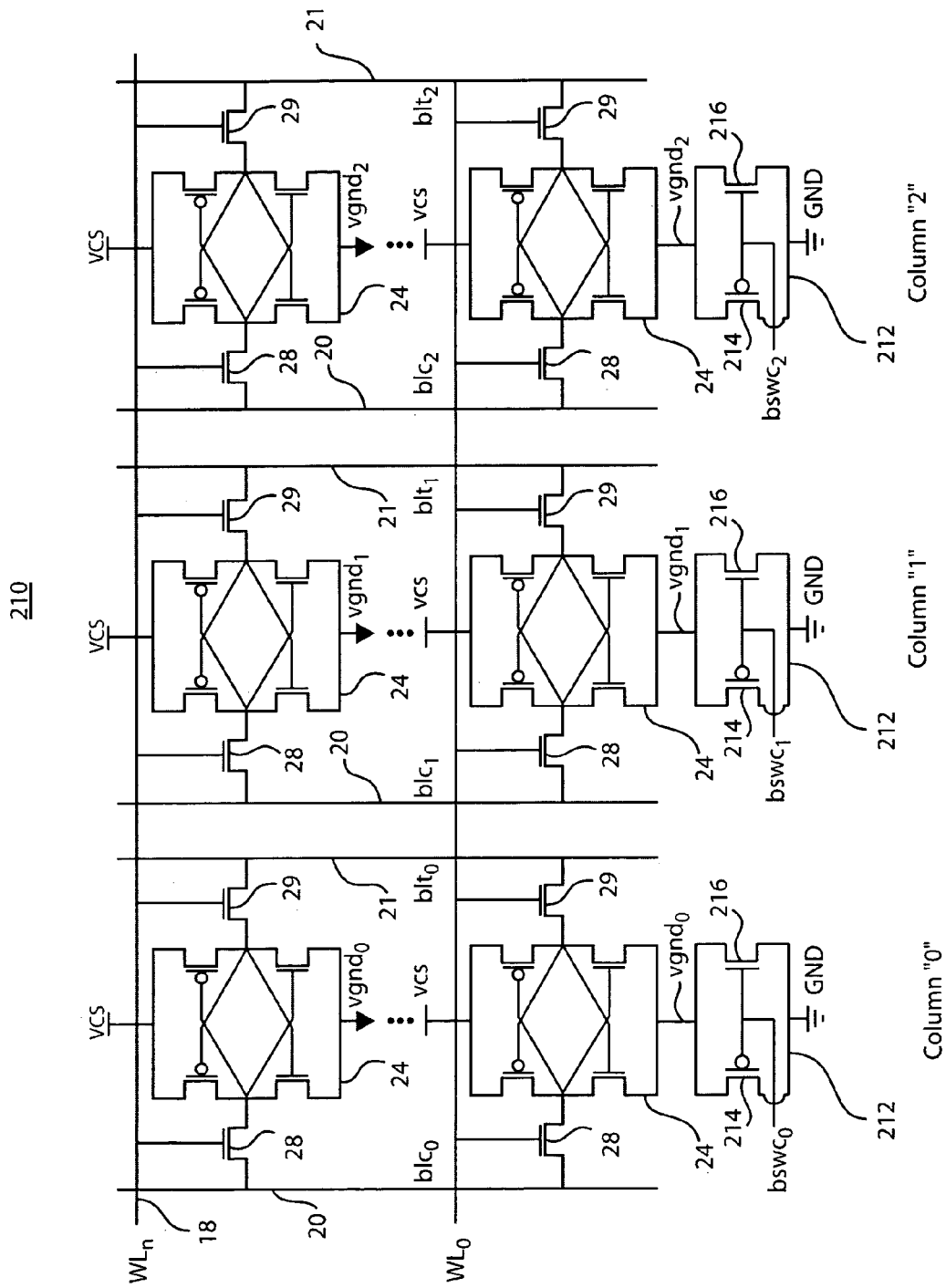
FIG. 6 is a schematic diagram of an illustrative memory device showing a logic circuit for adjusting ground potential in accordance with another aspect of the present invention.

In accordance with the present invention, the columns are gated with the logic circuit 12 (FIG. 1) and/or 212 (FIG. 6). In this way, the column and therefore the cells 24 only turn on when the column is selected. Otherwise, the cells are shut off (or get unselected). This helps to prevent any current of bitlines from leaking into the adjacent cells and thereby prevents flipping the cells. Therefore, stability of the cell is greatly improved.

In addition, for "half selected" columns (i.e., when unselected columns with the wordline on, the precharged bitlines can dump charge into the unselected cells on the selected wordline), the control signal bswc to the PFET 14 of the unselected column is low. This sets the virtual power at VCS thus making the cell PFETs 32 and 34 very strong and thereby holding their state.

Since the PFETS 32 and 34 have high mobility (e.g., the ratio of PFET and NFET mobilities is higher as compared to conventional substrate technologies), therefore, the PFETS can operate at higher voltages and the "half select stability" can be significantly improved.

The minimum voltage needed to write a state (Vmin) can be improved as well as the PFETS with high mobilities can operate at much lower voltages during "write" operations.

During a read operation, the supply voltage for the cells 24 is VCS. PFETS 32 and 34 and NFETS 36 and 38 are stronger due to VCS and higher mobility technology, this helps reading the data and makes the reading process more robust. Thus, for both the read and write operations optimum device strength can be achieved to prevent stability degradation.

Figure 3:
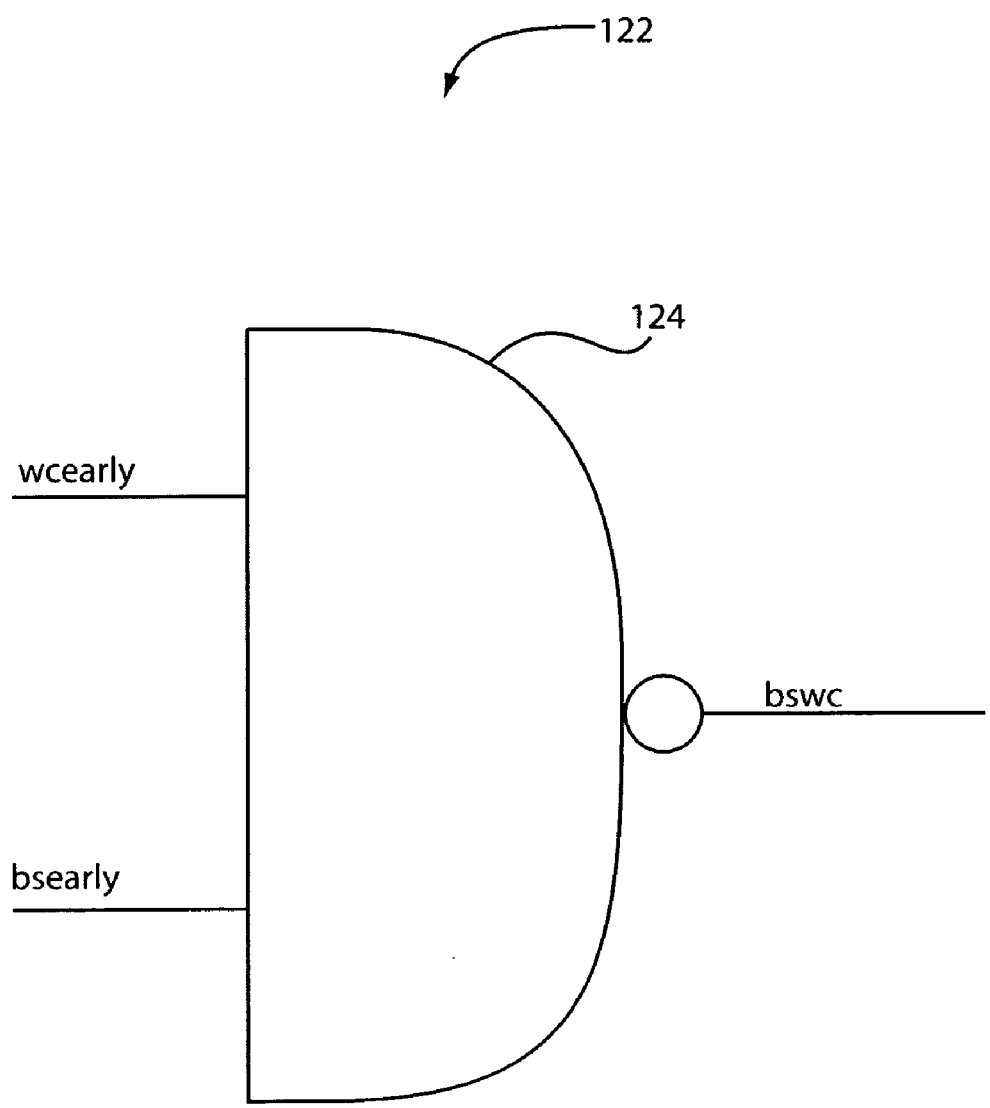
FIG. 3 is a schematic diagram of an alternative control circuit in accordance with one aspect of the present invention.

Referring to FIG. 3, logic circuit 22 (FIG. 1) may include other configurations. In another embodiment, circuit 22 may be replaced with a device or circuit 122 for providing the "control signal" select signal (bswc). This embodiment illustratively shows a NAND gate 124, which receives bsearly and wcearly signals as inputs. Other gate or circuits are also contemplated.

Figure 4:
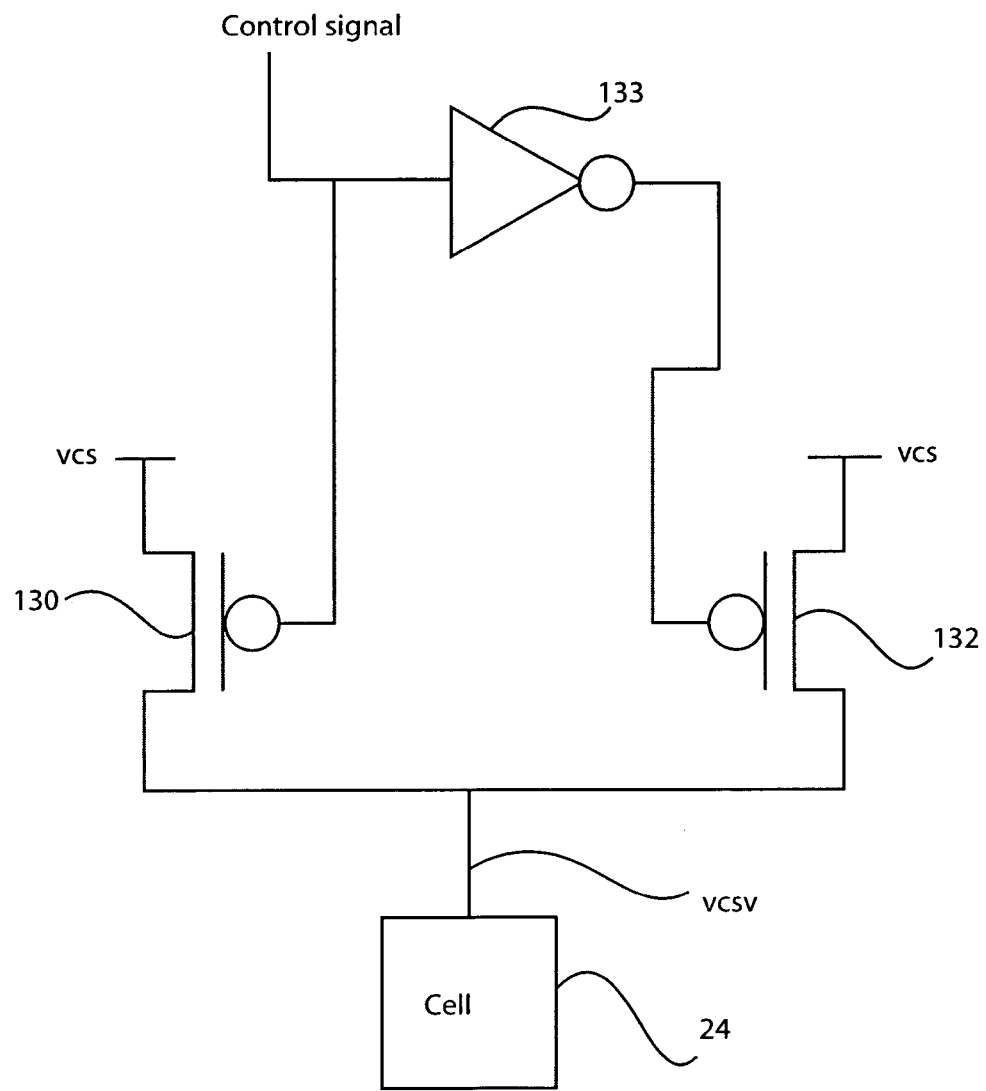
FIG. 4 is a schematic diagram of another illustrative memory device showing two PFETs used in the logic circuit in accordance with another aspect of the present invention.

Referring to FIG. 4, other embodiments of the present invention include alternate configurations of circuit 12 (FIG. 1). In one example, instead of PFET 14 and NFET 16, two PFETS 130 and 132 (or two NFETS) are employed in circuit 12 to adjust power to cells 24 (FIG. 1) in accordance with write or read operations for selected columns. These two PFETS 130 and 132 are controlled by a control signal. One of the PFETs preferably includes a higher Vt and the other one is a lower or regular Vt (e.g., they may have a Vt or multiple Vt difference, e.g., 1:4). PFET 130 is controlled by an external control signal, while PFET 132 is controlled by the inverted external control signal using an inverter 133 driving PFET 132.

The power supply decreases during the write/column select while half select is maintained at higher supply voltage. This is achieved by selecting ratios of device strength of PFET 130 and 132, e.g., 1:4 is preferred, however, other ranges, e.g., 1:2, 1:3, are possible.

Other embodiments may include two NFETS, preferably having different threshold voltages (Vt) for circuit 12 or a plurality of different transistor circuits, diodes, impedances, etc. to provide the functionality as described above with reference to FIG. 1. In addition, a logic circuit 212 (FIG. 6) may be include to provide similar performance and function as described for circuit 12.

Figure 5:
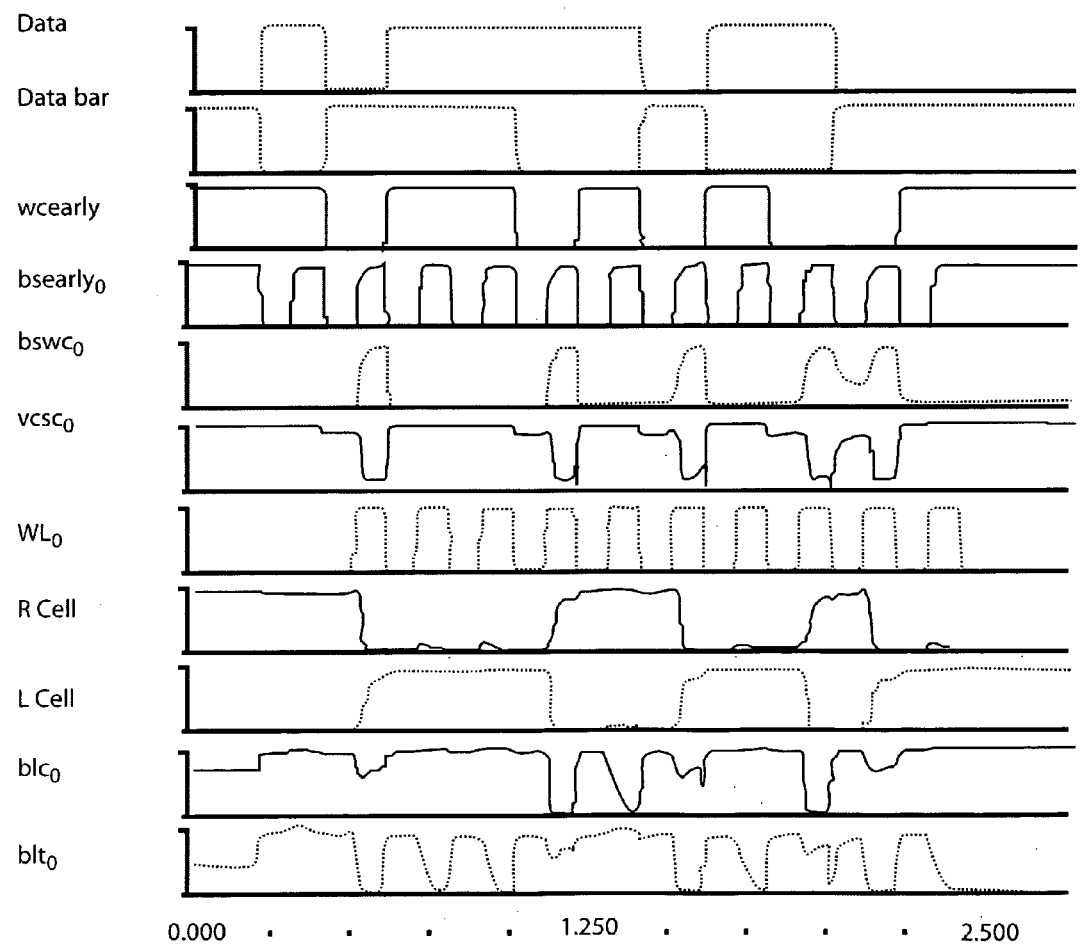
FIG. 5 is a timing diagram showing waveforms for dynamic power supply adjustment in accordance with one aspect of the present invention.

Referring to FIG. 5, waveforms showing dynamic power supply (Yo—Yo power supply meaning power oscillates or varies like a "yo—yo"). This shows the workability and stability provided by the present invention as illustratively shown in FIG. 1. FIG. 5 is a timing diagram labeled in accordance with signals shown in FIG. 1.

Data and Data bar show the data in for bitlines $blc_0$ and $blt_0$ for column 1. wcearly and bsearly signals are shown and are employed to generate $bswc_0$. $VCSV_0$ is shown corresponding to the cell voltage. $WL_0$ is the wordline signal. R cell and L cell show voltage levels for the right and left sides of the selected memory cells in the first column (column 0) of FIG. 1.

Referring to FIG. 6, similar to Vdd (VCS) adjustment to reduce or bump down the supply voltage to cells based on column based read-write operation, a ground bump up may also be provided based on read-write operations as well. A logic circuit 212 may be coupled to each column. Logic circuit 212 may include many configurations.

In one embodiment, logic circuit includes an NFET 214 and a PFET 216. The NFET 214 and PFET 216 may be controlled by a bswc signal as before. In FIG. 6, if column 0 is selected, $bswc_0$ controls NFET 214 and PFET 216 in a similar fashion as described for circuit 10 in FIG. 1. Instead of a ground potential, a virtual ground (vgnd and for column 0, $vgnd_0$) is established for cells 24 in column 0. Depending on the operation, read/write and the data (0, 1), NFET 214 and PFET 216 permit the grounding of cells 24 for a selected column to be ground (GND) potential or vgnd potential, which includes GND minus the voltage drop across the active transistor.

In other embodiment, instead of one PFET and NFET, two NFETs or two PFETS with different strengths or Vts can be used. Several devices (NFETS or PFETS) may be employed to adjust the ground bump up in potential (e.g., several threshold voltage drops). For example, during a write operation, the supply voltage VCS may be adjusted to VCSV while the ground potential is brought up from GND to vgnd.

It is to be understood that circuits 12 and 212 may be employed in the same column to make adjustments to potentials during memory operations. Both Vdd bump down and ground bump up can be used simultaneously or separately enabled during operation. Circuits 12 and 212 may be operated using the same control signal, e.g., bswc or different control signals. Each of logic circuits 12 and 212 may further be independently selected during operations.

Having described preferred embodiments of a stable memory with high mobility cell devices (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A random access memory, comprising:
    a logic circuit coupled to a potential of a column having at least one memory cell, the logic circuit being configured to adjust the potential for the at least one memory cell in the column in accordance with a control signal; and
    a control circuit coupled to the logic circuit, the control circuit being configured to generate the control signal in accordance with an operation type and whether the column is selected, such that the logic circuit selects the potential in accordance with the control signal.

2. The memory as recited in claim 1, wherein the logic circuit includes two transistors coupled in parallel.

3. The memory as recited in claim 2, wherein the two transistors include a same type having different threshold voltages.

4. The memory as recited in claim 2, wherein gates of the two transistors receive the control signal.

5. The memory as recited in claim 1, wherein the logic circuit includes an NFET and a PFET.

6. The memory as recited in claim 1, wherein the control circuit includes an inverter, which is enabled by an operation type signal and inverts a column select type signal to provide the control signal.

7. The memory as recited in claim 1, wherein the control circuit includes a NAND gate, which receives an operation type signal and a column select type signal as inputs to provide the control signal.

8. The memory as recited in claim 1, wherein the logic circuit includes a transistor and the potential is reduced or increased by a threshold voltage drop across the transistor when the column controlled by the logic circuit is selected and the operation of the column is a write operation.

9. The memory as recited in claim 1, wherein the potential is a supply voltage and the supply voltage is reduced by a threshold voltage drop across a transistor of the logic circuit.

10. The memory as recited in claim 9, further comprising a data driver coupled to a bitline of the column wherein a supply voltage to the data driver is greater than the supply voltage of the memory cell during a write operation.

11. The memory as recited in claim 1, wherein the memory cell includes high mobility transistor devices which are responsive to the potential supplied by the logic circuit.

12. The memory as recited in claim 1, wherein the potential is a ground potential and the potential is increased by a threshold voltage drop across a transistor of the logic circuit.

13. A random access memory, comprising:
a logic circuit having at least two transistors coupled in parallel, the logic circuit being coupled to a potential of a column having at least one memory cell, the logic circuit adjusting the potential for the at least one memory cell in the column in accordance with a control signal;
a control circuit having an output coupled to gates of the at least two transistors, the control circuit generating the control signal in accordance with an operation type and whether the column is selected, such that the logic circuit adjusts the potential in accordance with the control signal.

14. The memory as recited in claim 13, wherein the logic circuit includes two transistors coupled in parallel.

15. The memory as recited in claim 14, wherein the two transistors are of a same type having different threshold voltages.

16. The memory as recited in claim 14, wherein gates of the two transistors receive the control signal.

17. The memory as recited in claim 13, wherein the control circuit includes an inverter, which is enabled by an operation type signal and inverts a column select type signal to provide the control signal.

18. The memory as recited in claim 13, wherein the control circuit includes a NAND gate, which receives an operation type signal and a column select type signal as inputs to provide the control signal.

19. The memory as recited in claim 13, wherein the logic circuit includes a transistor and the potential is reduced or increased by a threshold voltage drop across the transistor when the column controlled by the logic circuit is selected and the operation of the column is a write operation.

20. The memory as recited in claim 13, wherein the potential is a supply voltage and the supply voltage is reduced by a threshold voltage drop across a transistor of the logic circuit.

21. The memory as recited in claim 13, further comprising a data driver coupled to a bitline of the column wherein a supply voltage to the data driver is greater than the supply voltage of the memory cell during a write operation.

22. The memory as recited in claim 13, wherein the memory cell includes high mobility transistor devices which are responsive to the potential supplied by the logic circuit.

23. The memory as recited in claim 13, wherein the potential is a ground potential and the potential is increased by a threshold voltage drop across a transistor of the logic circuit.

24. A static random access memory, comprising:
a plurality of memory cells arranged in columns, each memory cells including a plurality of high mobility transistors cross-coupled to store data;
a first logic circuit coupled to a column power supply and a power supply node for the memory cells of that column, the logic circuit for adjusting the supply voltage for the memory cells in the column in accordance with a control signal;
a second logic circuit coupled to a column ground and a cell ground node for the memory cells of that column, the logic circuit for adjusting a ground potential for the memory cells in the column in accordance with the control signal; and
a control circuit having an output coupled to the first and second logic circuits to generate the control signal in accordance with an operation type and whether the column is selected, such that the first and second logic circuit adjust the supply voltage and/or the ground potential in accordance with the control signal.

25. The memory as recited in claim 24, wherein the first and second logic circuits each include two transistors coupled in parallel.

26. The memory as recited in claim 24, wherein the control circuit includes an inverter, which is enabled by an operation type signal and inverts a column select type signal to provide the control signal.

27. The memory as recited in claim 24, wherein the control circuit includes a NAND gate, which receives an operation type signal and a column select type signal as inputs to provide the control signal.

28. The memory as recited in claim 24, wherein the supply voltage and/or ground potential is/are adjusted by a threshold voltage drop across a transistor when the column controlled by the logic circuit is selected and the operation of the column is a write operation.

29. The memory as recited in claim 24, further comprising a data driver coupled to a bitline of the column wherein a supply voltage to the data driver is greater than the supply voltage of the memory cell during a write operation.

30. The memory as recited in claim 24, wherein the logic circuit includes transistors of a same type coupled in parallel and including different threshold voltages.

* * * * *